United States Patent [19]

Shimizu

[11] Patent Number: 4,982,408
[45] Date of Patent: Jan. 1, 1991

[54] VARIABLE OSCILLATION WAVELENGTH SEMICONDUCTION LASER DEVICE

[75] Inventor: Akira Shimizu, Inagi, Japan

[73] Assignee: Canon Kabushiki Kaisha, Tokyo, Japan

[21] Appl. No.: 511,921

[22] Filed: Apr. 16, 1990

Related U.S. Application Data

[63] Continuation of Ser. No. 398,320, Aug. 25, 1989, abandoned, which is a continuation of Ser. No. 157,802, Feb. 19, 1988, abandoned.

[30] Foreign Application Priority Data

Feb. 27, 1987 [JP] Japan ............................ 62-044936
Feb. 27, 1987 [JP] Japan ............................ 62-044939

[51] Int. Cl.$^5$ .................... H01S 3/19; H01S 3/082
[52] U.S. Cl. ................................ 372/45; 372/23; 372/50; 372/97
[58] Field of Search ............... 372/45, 46, 50, 23, 372/97; 357/4

[56] References Cited

U.S. PATENT DOCUMENTS

4,602,370 7/1986 Tsang ........................ 372/45

FOREIGN PATENT DOCUMENTS

0254568 1/1988 European Pat. Off. .
0190392 11/1982 Japan ........................ 372/45
59-104191 6/1984 Japan .
59-106171 6/1984 Japan .
61-168983 7/1986 Japan .

OTHER PUBLICATIONS van der Ziet, "Laser Oscillation from Quantrum States in Very Fine GaAs-Al$_{0.2}$Ga$_{0.8}$As Multilayer Structures", Appl. Phys. Lett. vol. 26, No. 8, Apr. 15, 1975, pp. 463–465.

Tsang "Cu Multiwavelength Trasverse Junction-Stripe Laser Grown by Molecular Beam Epitaxy Operating Predominantly in Single-Longitudinal Modes," Appl. Phys. Lett, vol. 36, No. 6, Mar. 15, 1980, pp. 441–443.

Applied Physics Letters, vol. 50, No. 7, Feb. 1987, pp. 392–394, American Institute of Physics, N.Y. Deppe et al., "Impurity-Induced Layer-Disordered Buried Heterostructure Al$_x$Gg1-xAs-GsAs Quantum Well Edge-Injection Laser Array".

Primary Examiner—Georgia Epps
Attorney, Agent, or Firm—Fitzpatrick, Cella Harper & Scinto

[57] ABSTRACT

In a semiconductor laser device for emitting a laser beam of a variable frequency depending on a current applied to the laser device, there are provided a semiconductor substrate, an optical waveguide structure formed on the substrate having two or more semiconductor light emission layers and barrier layers having a wider band gap then that of the light emission layers, alternately stacked, clad layers stacked on the opposite sides of the waveguide structure and having a lower refractive index than that of the waveguide structure, and a device for applying a current to the light emission layers, and the wave guide structure includes at least first and the second light emission layers which respectively emit lights having different wavelengths.

12 Claims, 5 Drawing Sheets

VARIABLE OSCILLATION WAVELENGTH SEMICONDUCTION LASER DEVICE

This application is a continuation of application Ser. No. 07/398,320 filed Aug. 25,1989, which is a continuation of U.S. application Ser. No. 07/157,802 which was filed Feb. 19, 1988 now abandoned.

BACKGROUND OF THE INVENTION

1. Field of the Invention

The present invention relates to a semiconductor laser device, and more particularly to a semiconductor laser device which emits a laser beam of a variable frequency depending upon a current applied to the device.

2. Related Background Art

Demands for a semiconductor laser device in a light communication field and a optical information processing field have been rapidly increasing including more versatile functionality. A semiconductor laser device having a variable wavelength is one of the functions. For example, when information is to be recorded and reproduced by irradiating a laser beam to a medium such as an optical card or an optical disk, writing by a reproduced light is prevented by setting an output of the reproduced light to be lower than a recording light. By setting the wavelength of the reproduced light to a low sensitivity area of the medium, the writing can be prevented without significantly reducing the output of the reproduced light and the information is reproduced with a high S/N ratio.

For the above requirement, a variable wavelength semiconductor laser device which uses a high order quantum level of a multi-quantum well (MQW) has been proposed. FIG. 1 shows an energy band in a vicinity of a light emission region in the prior art semiconductor laser device. A light emission laser 23 has a MQW structure having well layers 22 and barrier layers 21 alternately laminated. Clad layers 20 are provided on the opposite sides of the light emission region 23 and the barrier layers 19 to form an optical wave guide structure 24. When a current is injected to the semiconductor laser element, electrons 25 are stored at an energy level $E_0$ and recombine with holes 26 so that a light between quantum levels of n=0 (n: principal quantum number) is generated (wavelength $\lambda_1$). As the injection current increases, a carrier density of an energy level $E_1$ increases so that a light between quantum levels of n=1 is generated (wavelength $\lambda_2$) by recombination. In this manner, lights of different wavelengths are generated from one device.

However, the prior art variable wavelength semiconductor laser element has the following problems.

(I) In order to generate lights of different wavelengths, it is necessary that absorption loss and mirror loss are significantly larger than normal, and hence the device efficiency is low.

(II) Since different quantum levels are merely used, the difference between the generated wavelengths is several tens nm at most.

(III) Since it is necessary to form a quantum well having two or more levels, one-level quantum well cannot be used even if such a device improves a characteristic.

IV It is difficult to switch the wavelength. (Namely, once a light of a wavelength $\lambda_2$ is generated, it is difficult to stop the generation of a light of a wavelength $\lambda_1$.)

SUMMARY OF THE INVENTION

It is an object of the present invention to provide a variable wavelength semiconductor laser device which has a wide variable wavelength range and operates at a high efficiency.

It is another object of the present invention to provide a variable wavelength semiconductor laser device which permits easy switching of an oscillation wavelength.

The above objects of the present invention are achieved by a semiconductor laser device comprising a semiconductor substrate, an optical wave guide structure having two or more semiconductor light emission layers formed on the substrate including at least first and second light emission layers for generating lights of different wavelengths and barrier layers having a wider band gap than that of the light emission layers, alternately stacked, clad layers having a lower refractive index than that of the optical wave guide structure arranged on the opposite sides of the structure, and means for applying a current to the semiconductor light emission layers. In order to switch the wavelength in the device, parameters are set such that a light gain of the light emission layer of a longer oscillation wavelength is positive in an oscillation wavelength of one of light emission layers of shorter oscillation wavelength when a current close to an oscillation threshold is applied to the light emission layers.

DETAILED DESCRIPTION OF THE PREFERRED EMBODIMENTS

Figure 1:
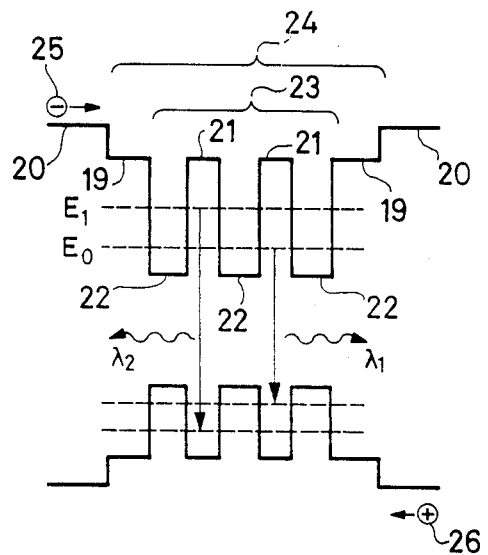
FIG. 1 shows an energy band of a conventional variable wavelength semiconductor laser device.
Figure 2:
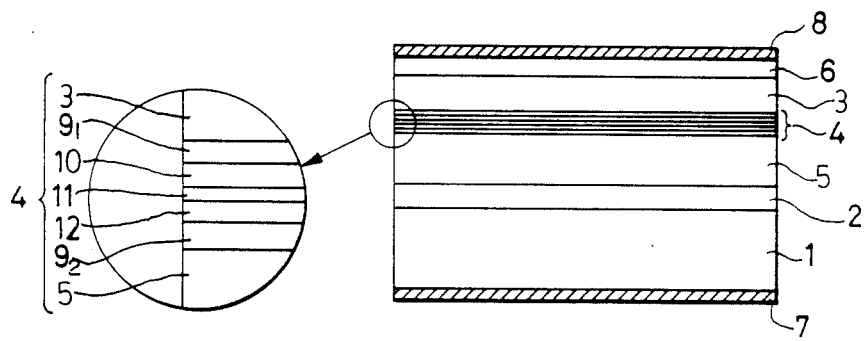
FIG. 2 shows a sectional view of one embodiment of the semiconductor laser element of the present invention.

FIG. 2 shows a sectional view of one embodiment of a semiconductor laser device of the present invention. Numeral 1 denotes an n-type GaAs substrate, numeral 2 denotes an n-type GaAs buffer layer, numeral 5 denotes an n-type AlGaAs clad layer, numeral 4 denotes an optical wave guide structure, numeral 3 denotes a p-type AlGaAs clad layer, numeral 6 denotes a p-type GaAs cap layer and numerals 7 and 8 denote electrodes.

The optical wave guide structure 4 comprises a stack of a p-type AlGaAs barrier layer 9₂, a second non-doped GaAs light emission layer 2, a p-type AlGaAs barrier layer 11, a first non-doped AlGaAs light emission layer 10 and a p-type AlGaAs barrier layer 9₁, sequentially stacked on the clad layer 5. The clad layers 3 and 5 have lower refractive indexes than that of the optical wave guide structure 4 and function to confine the light emitted by the light emission layers in the structure 4.

The device is fabricated by growing the various semiconductor layers having different energy gaps on the substrate 1 by a conventional semiconductor fabrication method, such as liquid phase epitaxy (LPE) method, organic metal vapor phase growth (MO-CVD) method or molecular beam epitaxy (MBE) method. A laser resonance plane is formed by cleaning the semiconductor stack. A striped active region may be formed by restricting a current injection area parallelly to the resonance plane by known means such as a current restriction layer.

Figure 3:
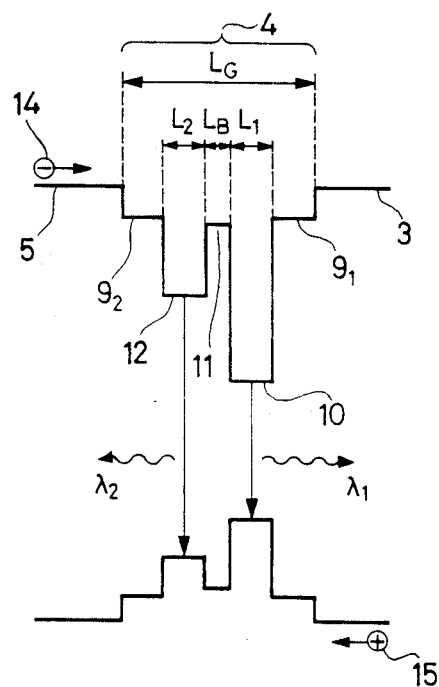
FIG. 3 shows an energy band of the device of FIG. 2.

FIG. 3 shows an energy band in a vicinity of the optical wave guide structure of the device shown in FIG. 2. The like elements to those shown in FIG. 2 are designated by the like numerals and detailed explanation thereof is omitted. As shown, the first light emission layer 10 has a narrower band gap than the second light emission layer 12. The buffer layers 9₁, 9₂ and 11 have wider band gaps than those of the light emission layers 10 and 12.

When a current is applied to the electrodes 7 and 8 of FIG. 2 by a power supply not shown, electrons 14 are injected to the first light emission layer 10 and the second light emission layer 12, and the electrons 14 and the holes 15 in the first light emission layer 10 recombine to induce-emit a light having a wavelength $\lambda_1$. As the injection current is increased, the electrons and the holes 15 recombine in the second light emission layer 12, too, to induce-emit a light having a wavelength $\lambda_2$.

Figure 4:
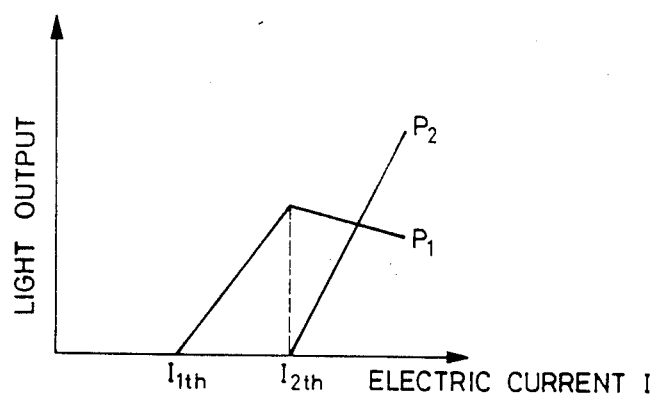
FIG. 4 shows a current-light output characteristic in the device of FIG. 2.

A current-light output characteristic of the device is shown in FIG. 4, in which I denotes a current and $P_1$ and $P_2$ denote the output of the lights having the wavelengths $\lambda_1$ and $\lambda_2$, respectively. As the current I is increased, the light having the wavelength $\lambda_1$ is generated at a first threshold current $I = I_{1th}$, and the light having the wavelength $\lambda_2$ is generated at a second threshold value $I = I_{2th}$.

Figure 7:
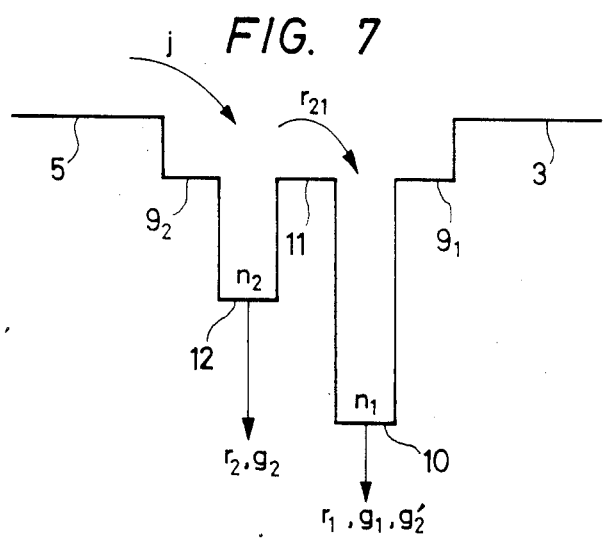
FIG. 7 shows an energy band for illustrating a principle of operation of the device of FIG. 2.

A principle of operation of the semiconductor laser device of the present invention is explained with reference to FIG. 7, which shows an upper half of the energy band of the device of FIG. 2 and in which the like elements to those shown in FIG. 3 are designated by the like numerals and explanation thereof is omitted. In FIG. 7, $n_1$ and $n_2$ represent carrier densities in the first light emission layer 10 and the second light emission layer 12, respectively, and j represents an injection current density. Carriers injected into the second light emission layer 12 are spontaneously emitted or recombine with no light emission at a rate $r_2$, transfer to the first light emission layer 10 at a rate $r_{21}$ and the remaining carriers recombine with induction emission. Further, the carriers transferred to the first light emission layer are spontaneously emitted or recombine with no light emission at a rate r and the remaining carriers recombine with induction emission. Rate equations under this condition are expressed as follows (e (electron charge) = 1).

$$L_2 \frac{dn_2}{dt} = j - L_2 \cdot \left[ r_{21}n_2 + r_2 n_2 + \frac{P_2}{\hbar\omega_2} \cdot \frac{\Gamma_2}{L_2 S_2} \cdot g_2(n_2) \right] \quad (1)$$

$$L_1 \frac{dn_1}{dt} = L_2 r_{21} n_2 - L_1 \cdot$$
$$\left[ r_1 n_1 + \frac{P_1}{\hbar\omega_1} \cdot \frac{\Gamma_1}{L_1 S_1} \cdot g_1(n_1) + \frac{P_2}{\hbar\omega_2} \cdot \frac{\Gamma_2'}{L_2 S_2} \cdot g_2'(n_1) \right] \quad (2)$$

where $\hbar\omega_1$ and $\hbar\omega_2$ are photon energies of the lights having the wavelengths $\lambda_1$ and $\lambda_2$, respectively, $S_1$ and $S_2$ are beam widths of the lights having the wavelengths $\lambda_1$ and $\lambda_2$, respectively, $\Gamma_1$ and $g_1(n_1)$ are confine coefficient and gain of the light having the wavelength $\lambda_1$ in the first light emission layer 10, $\Gamma_2$ and $g_2(n_2)$ are confine coefficient and gain of the light having the wavelength $\lambda_2$ in the second light emission layer 12, $\Gamma_2'$ and $g'(n_1)$ are confine coefficient and gain of the light having the wavelength $\lambda_2$ in the first light emission layer 10, and $L_1$ and $L_2$ are thickness of the first light emission layer and the second light emission layer, respectively.

Steady state solutions of the above rate equations are obtained by the following three regions while taking saturation of the carrier density in the oscillation into account.

(i) $P_1 = P_2 = 0 (j < j_{1th})$ $$n_2 = \frac{1}{L_2(r_{21} + r_2)} \cdot j \quad (3)$$

$$n_1 = \frac{r_{21}}{L_1 r_1 (r_{21} + r_2)} \cdot j \quad (4)$$

(ii) $P_1 > 0, P_2 = 0 (j_{1th} \leq j < j_{2th})$ $$n_2 = \frac{1}{L_2(r_{21} + r_2)} \cdot j \quad (5)$$

$$n_1 = n_{1th} \left( = \frac{r_{21}}{L_1 r_1 (r_{21} + r_2)} \cdot j_{1th} \right) \quad (6)$$

$$\frac{P_1}{\hbar\omega_1} = \frac{S_1}{\Gamma_1} \cdot \frac{1}{g_1(n_{1th})} \cdot \frac{r_{21}}{r_{21} + r_2} \cdot (j - j_{1th}) \quad (7)$$

(iii) $P_1 > 0, P_2 > 0 (j_{2th} \leq j)$ $$n_2 = n_{2th} \left( = \frac{1}{L_2(r_{21} + r_2)} \cdot j_{2th} \right) \quad (9)$$

$$n_1 = n_{1th} \quad (10)$$

$$\frac{P_2}{\hbar\omega_2} \cdot \frac{S_2}{\Gamma_2} \cdot \frac{1}{g_2(n_{2th})} \cdot (j - j_{2th}) \quad (11)$$

$$\frac{P_1}{\hbar\omega_1} = \frac{S_1}{\Gamma_1} \cdot \frac{1}{g_1(n_{1th})} \cdot \left[ \frac{r_{21}}{r_{21} + r_2} \cdot (j_{2th} - j_{1th}) - \frac{P_2}{\hbar\omega_2} \cdot \frac{\Gamma_2'}{S_2} \cdot g_2'(n_{1th}) \right] = \frac{S_1}{\Gamma_1} \cdot \frac{1}{g_1(n_{1th})} \cdot \left[ \frac{r_{21}}{r_{21} + r_2} \cdot (j_{2th} - j_{1th}) - \frac{g_2(n_{2th}) \cdot g_2'(n_{1th})}{\Gamma_2 \Gamma_2'} \cdot (j - j_{2th}) \right] \quad (12)$$

Figure 5:
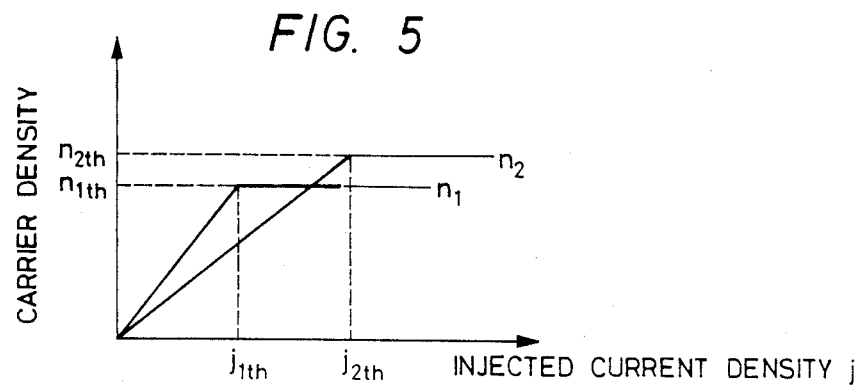
FIG. 5 shows a change of a carrier density in light emission layers to an injection current density in the device of FIG. 2.
Figure 6:
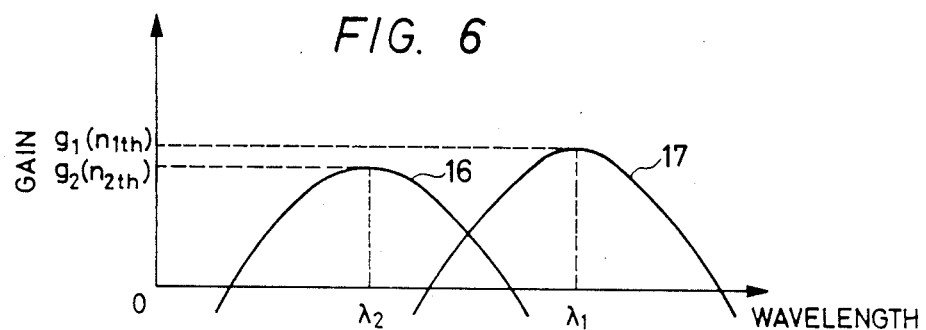
FIG. 6 shows a light gain characteristic in the device of FIG. 2.

For easier understanding, a change of the carrier density to the injection current density j is shown in FIG. 5. A carrier density $n_1$ in the first light emission layer saturates at $j = j_{1th}$. A carrier density $n_2$ in the second light emission layer saturates at $j=j_{2th}$. Heretofore, the saturation carrier densities $n_{1th}$ and $n_{2th}$ were assumed as if they were constant. In actual, however, they slightly change. Even when such a change is taken into account, the status changes (i)→(ii)→(iii) as the injection current increases. FIG. 6 shows a gain distribution of the semiconductor laser device of the present invention when $I_{2th}<I$. Numerals 17 and 16 denote light gains of the first light emission layer 10 and the second light emission layer 12, respectively.

The wavelengths $\lambda_1$ and $\lambda_2$ and the threshold currents $I_{1th}$ and $I_{2th}$ can be selected by the thickness of the first light emission layer 10, the second light emission layer 12 or the gap layer 11 and mixed crystal ratio and doping.

In the semiconductor laser device of the present invention, the light having the wavelength $\lambda_1$ and the light having the wavelength $\lambda_2$ are both guided in the optical wave guide and those lights are emitted from the essentially same point on the end plane of the laser.

The change of the wavelength in accordance with the present invention does not occur without condition. The operational condition thereof and specific design of the device are explained below.

Laser oscillation conditions are shown below. When $$G_1 = \Gamma_1 g_1(n_1) - \alpha_1 - \frac{1}{L}\ln\left(\frac{1}{R}\right) \tag{13}$$

$$G_2 = \Gamma_2 g_2(n_2) + \Gamma'_2 g'_2(n_1) - \alpha_2 - \frac{1}{L}\ln\left(\frac{1}{R}\right) \tag{14}$$

oscillation condition for the light having the wavelength $$\lambda_1: G_1 = 0 \tag{15}$$

oscillation condition for the light having the wavelength $$\lambda_2: G_2 = \tag{16}$$

where $\alpha_1$: loss coefficient of the light having the wavelength $\lambda_1$ $\alpha_2$: loss coefficient of the light having the wavelength $\lambda_2$ L: length of a resonator of the semiconductor laser device R: (mean) reflection rate of an end plane of the resonator From those, equations (17) et seq. are derived.

(a) $n_{1th}$ and $j_{1th}$,
From the equations (4), (18) and (20), $n_{1th}$ and $j_{1th}$ are given as follows.

$$g_1(n_{1th}) = \frac{1}{\Gamma_1}\left(\alpha_1 + \frac{1}{L}\ln\left(\frac{1}{R}\right)\right) \tag{17}$$

$$j_{1th} = \frac{L_1 r_1(r_{21}+r_2)}{r_{21}} n_{1th} \tag{18}$$

(b) Condition that the light having the wavelength $\lambda_1$ oscillates first (operational condition for a variable wavelength laser)

From the equations (3), (14) and (16), the following condition is given.

$$\Gamma_2 g_2\left(\frac{L_1 r_1}{L_2 r_{21}} n_{1th}\right) + \Gamma'_2 g'_2(n_{1th}) - \alpha_2 \frac{1}{L}\ln\left(\frac{1}{R}\right) < 0 \tag{19}$$

(c) $n_{2th}$ and $j_{2th}$
From the equations (5), (6), (14) and (16), $n_{2th}$ is given by $$g_2(n_{2th}) = \frac{1}{\Gamma_2}\left[\alpha_2 + \frac{1}{L}\ln\left(\frac{1}{R}\right) - \Gamma'_2 g'_2(n_{1th})\right] \tag{20}$$

and $j_{2th}$ is given by $$j_{2th} = L_2(r_{21}+r_2) n_{2th} \tag{21}$$

Function forms of $g(n_1)$ and $g_2(n_2)$ depend on the structure of the activation layer, and the function forms for the specific structure can be readily calculated or measured by using the method shown in "Semiconductor Laser and Light Integrated Circuit:" edited by Suematsu, OHM Co. Ltd., 1984 or "Heterostructure Lasers", by Casey and Panish, Academic, 1978. Same is true for $\lambda_1$, $\lambda_2$, $r_1$, $r_2$, $r_{21}$, $\Gamma_1$, $\Gamma_2$, $\Gamma'_2$, $\alpha_1$ and $\alpha_2$. The results are put in the equations (17) et seq so that the condition for the desired characteristic is obtained.

For some combinations of x in the respective regions in FIG. 3 and the thickness $L_1$, $L_2$ $L_B$ and $L_G$, the $g_1(n_1)$, $g_2(n_2)$, $\lambda_1$, $\lambda_2$, ... are determined by the above method. The results are put in the equations (17) et seq and the operational condition for the variable wavelength laser (condition of the equation (19)) is checked and $j_{1th}$ and $j_{2th}$ are determined. Thus, specific x and $L_1$, $L_2$, ... for the variable wavelength laser for the desired characteristic are determined. Consequently, the semiconductor laser device can be fabricated as readily as the conventional semiconductor laser device is fabricated, by using MBE method, MO CVD method or LPE method.

As an example, a method for controlling the magnitude of $j_{1th}$ is specifically described In order to reduce $j_{1th}$, $L_1$ may be reduced or $r_{21}$ may be increased as seen from the equation (18). In order to increase $r_{21}$, a difference between band gaps of the barrier layer 11 and the second light emitting layer 12 may be reduced or the width $L_B$ of the barrier layer may be reduced. Further. $j_{1th}$ may be reduced by changing the width $L_G$ of the optical wave guide structure to increase $\Gamma_1$. On the other hand, in order to increase $j_{1th}$, the reversal of the above is carried out.

Specific examples of the present invention are described below.

EXAMPLE 1

The semiconductor laser device of the structure shown in FIG. 2 was fabricated by the molecule beam epitaxy method. An n-type GaAs buffer layer 2 having a thickness of 1 μm and an n-type (impurity concentration $5\times10^{17}$cm$^{-3}$) $Al_{0.7}Ga_{0.3}As$ clad layer 5 having a thickness of 2 μm were grown on an n-type GaAS substrate 1. Then, a barrier layer $9_2$, a second light emission layer 12, a barrier layer 11, a first light emission layer 10 and a barrier layer $9_1$ were sequentially grown on the clad layer 5. The first light emission layer 10 was a non-doped GaAs, the second light emission layer 12 was a non-doped $Al_{0.1}Ga_{0.9}As$ and the barrier layers $9_1$, 11 and 9₂ were p-type (impurity concentration $3 \times 10^{18}$ cm$^{-3}$) $Al_{0.3}Ga_{0.7}As$. The thicknesses of the layers were $L_1 = 200$ Å, $L_2 = 200$ Å, $L_b = 80$ Å and $L_G = 0.1$ μm in FIG. 3. A p-type (impurity concentration $1 = 10^{18}$cm$^{-3}$) $Al_{0.7}Ga_{0.3}As$ clad layer 5 having a thickness of 1.5 μm and a p-type GaAs cap layer 6 having a thickness of 0.5 μm were grown on the barrier layer 9₁. Portions of the cap layer 6 and the clad layer 3 were etched to a vicinity of the barrier layer 9₁ to form a striped recessed area, and an electrode 8 was vapor-deposited by using a dielectric mask so that it contacted only to the top of the non-etched cap layer 6. An electrode 7 was vapor-deposited to the bottom of the substrate 1. The laminated structure was cleaned to manufacture a semiconductor laser device having a laser resonance plane.

Gradually increasing current was applied to the device. At 110 mA, a laser beam of a wavelength 870 nm was emitted, and at 120 mA, a laser beam of a wavelength 800 nm was additionally emitted.

In the present invention, if the device is designed such that when a current close to an oscillation threshold is applied to the device, a light gain of the light emission layer for the longer oscillation wavelength is positive at the oscillation wavelength of one of the light emission layers for shorter oscillation wavelength, then the semiconductor laser device having the switchable wavelength (the light having the wavelength $\lambda_1$ is not generated when the light having the wavelength $\lambda_2$ is generated) is obtained. An example therefor is explained below.

Figure 8:
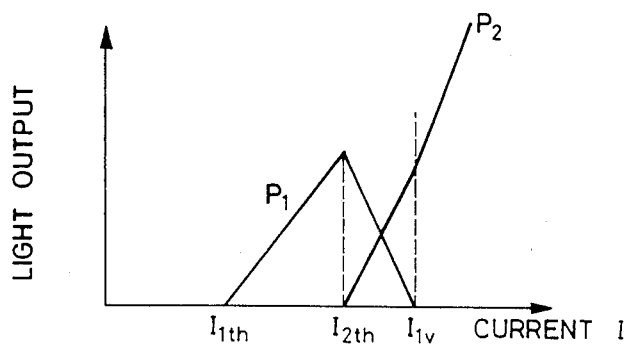
FIG. 8 shows a current-light output characteristic in another embodiment of the present invention.

Such a device is attained by appropriately selecting the materials of the light emission layers 10 and 12 in the structure of FIG. 2. FIG. 8 shows a current-light output characteristic of such device. In FIG. 8, I represents a current, and $P_1$ and $P_2$ represent light outputs of the wavelengths $\lambda_1$ and $\lambda_2$, respectively. As the current I is increased, the light having the wavelength $\lambda_1$ is generated at the first threshold current $I = I_{1th}$, and the light having the wavelength $\lambda_2$ is generated at the second threshold current $I = I_{2th}$. As the current is further increased, the light having the wavelength $\lambda_1$ stops to oscillate at $I = I_{1V}$ and only the light having the wavelength $\lambda_2$ is generated. Accordingly, by switching the injection current between a current which meets $I_{1th} < I < I_{2th}$ and a current which meets $I > I_{1V}$, the light having the wavelength $\lambda_1$ and the light having the wavelength $\lambda_2$ are selectively generated.

A principle of operation in the present example is similar to that explained with reference to FIG. 7, and rate equations therefor are given by the equations (1) and (2) as are done in the example of FIG. 4. Steady state solutions of the rate equations are given in four regions. They are equal to the regions (i) to (iii) shown by the equations (3)–(12) until the light having the wavelength $\lambda_2$ is generated. The region (iii) is defined in the range of $j_{2th} \leq j < j_{1V}$. There are following regions additionally.

(iv) $P_1 = 0, P_2 > 0 (j_{1V} \leq j)$ (22)
$n_2 = n_{2th}$ $$L_1 r_1 n_1 + \frac{P_2}{\hbar\omega_2} \cdot \frac{\Gamma'_2}{S_2} \cdot g'_2(n_1) = j - \quad (23)$$

$$L_2 r_2 n_{2th} - \frac{P_2}{\hbar\omega_2} \cdot \frac{\Gamma_2}{S_2} \cdot g_2(n_{2th})$$

$$\frac{P_2}{\hbar\omega_2} = \frac{S_2}{\Gamma_2} \cdot \frac{1}{g_2(n_{2th})} \cdot [j - L_2(r_{21} + r_2)n_{2th}] \quad (24)$$

From the equation (12), $$j_{1V} = j_{2th} + \frac{\Gamma_2 \Gamma'_2}{g_2(n_{2th}) g'_2(n_{1th})} \cdot \frac{r_{21}}{r_{21} + r_2} \cdot (j_{2th} - j_{1th}) \quad (25)$$

The behavior of FIG. 8 is understood from the above equations. From the equation (12), if $$g'_2(n_{1th}) > 0 \quad (26)$$

then $P_1$ decreases in the region of $I_{2th} \leq I > I_{1V}$, and $P_1 = 0$ when $I = I_{1V}$. Thus, the switching from the wavelength $\lambda_1$ to $\lambda_2$ is completed.

Figure 9:
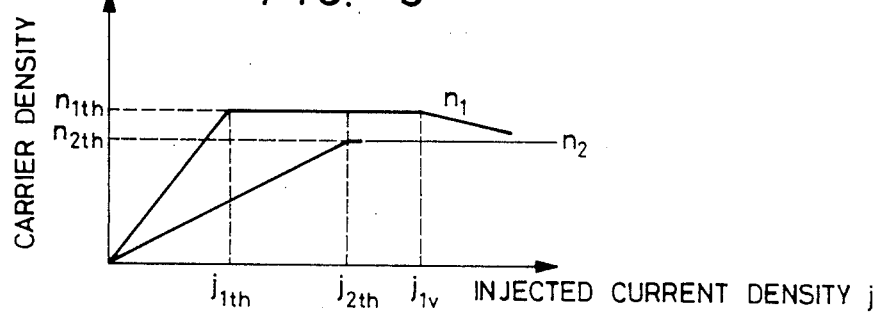
FIG. 9 shows a change of a carrier density in light emission layers to an injection current density in the other embodiment.

In order to facilitate understanding, a change of the carrier density to the injection current density j is shown in FIG. 9. The carrier density $n_1$ in the first light emission layer saturates at $j = j_{1th}$ and starts to decrease at $j = j_{1V}$. The carrier density $n_2$ in the second light emission layer saturates at $j = j_{2th}$. While it is assumed heretofore that $n_{1th}$ and $n_{2th}$ are constant, they actualy change slightly. Even if it is taken into account, the status still changes (i)→(ii)→(iii)→(iv) as the injection current increases.

Figure 10:
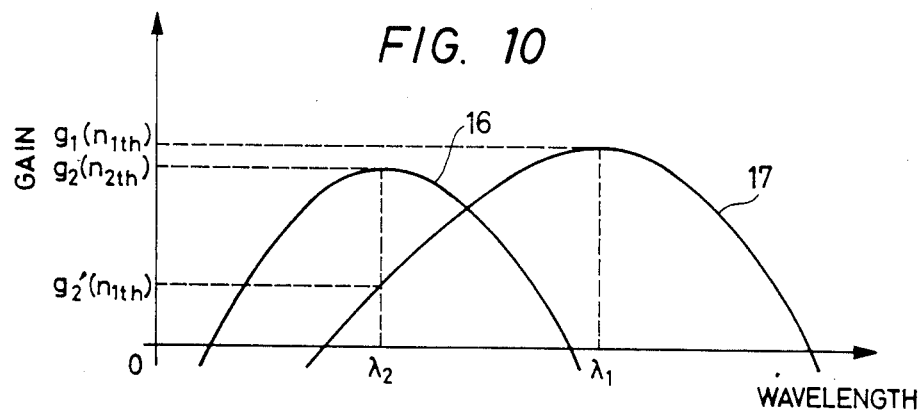
FIG. 10 shows a light gain characteristic in the other embodiment.

FIG. 10 shows a gain distribution of the semiconductor laser device of the present invention when $I_{2th} < I < I_{1V}$. Numerals 17 and 16 denote light gains of the first light emission layer 10 and the second light emission layer 12, respectively. If the light gain of the first light emission layer 10 is positive at the oscillation wavelength $\lambda_2$ of the second light emission layer 12, the process (iv) takes place so that the switching between the wavelengths $\lambda_1$ and $\lambda_2$ is carried out.

The $\lambda_1$, $\lambda_2$, $I_{1th}$, $I_{2th}$ and $I_{1V}$ may be set to any values by changing the thicknesses of the first light emission layer 10, the second light emission layer 12 and the gap layer 11, and the mixed crystal ratio and doping. When a difference between the wavelengths $\lambda_1$ and $\lambda_2$ is large, it is necessary that a wavelength range in which the light gain by the first light emission layer 10 is positive is wide in order to meet the condition of the equation (26). In this case, the width $L_1$ of the first light emission layer may be narrowed. As a result, $\Gamma$ is reduced and larger $n_1$ is required for $\Gamma_1 g_1(n_1)$ to reach a level necessary for the laser oscillation, and $n_{1th}$ increases. As a result, the wavelength region in which the gain is positive is widened.

The operational condition in the present embodiment requires the followings in addition to the conditions shown by the equations (17)–(21).

(d) Condition of existence of $j_{1V}$ (Condition of switching)

From the equation (12), the equation (26) is to be met.
(e) $j_{1V}$
It is given by the equation (25).

The design of the device in accordance with those conditions is done in the same manner as that for the embodiment of FIG. 4. An example is shown below.

EXAMPLE 2

A semiconductor laser device of the structure shown in FIG. 2 was fabricated by the molecule beam epitaxy method. An n-type GaAs buffer layer 2 having a thickness of 1 μm and an n-type (impurity concentration $5\times10^{17}cm^{-3}$) $Al_{0.6}Ga_{0.4}As$ clad layer 5 having a thickness of 2 μm were grown on an n-type GaAs substrate 1. Then, a barrier layer $9_2$, a first light emission layer 12, a barrier layer 11, a first light emission layer 10 and a barrier layer $9_1$ were sequentially grown on the clad layer 5. The first light emission layer 10 was non-doped GaAs, the second light emission layer 12 was non-doped $Al_{0.12}Ga_{0.88}As$. the barrier layer was p-type (impurity concentration $4\times10^{18}cm^{-3}$) $Al_{0.28}Ga_{0.72}As$, and the barrier layers $9_1$ and $9_2$ were p-type (impurity concentration $4\times10^{18}cm^{-3}$), $Al_{0.3}Ga_{0.7}As$. The thicknesses of the layers were $L_1=60Å$, $L_2=120Å$, $L_B=80Å$ and $L_G=0.2$ μm in FIG. 2. A p-type (impurity concentration $1\times10^{18}cm^{-3}$) $Al_{0.6}Ga_{0.4}As$ clad layer 3 having a thickness of 1.5 μm and a p-type GaAs cap layer 6 having a thickness of 0.5 μm were grown on the barrier layer $9_2$. Portions of the cap layer 6 and the clad layer 3 were etched to a vicinity of the barrier layer $9_1$ to form a striped recessed area. It was then masked by a dielectric layer and an electrode 8 was vapor-deposited so that it contacted only to the top of the unetched cap lay 6. An electrode 7 was vapor-deposited on the bottom of the substrate 1. The lamination was cleaned to manufacture a semiconductor laser device having a laser resonance plane.

A gradually increasing current was injected into the device. At 80 mA, a laser beam having a wavelength of 830 nm was emitted, and at 85 mA, a laser beam having a wavelength of 780 nm was additionally emitted. As the current was further increased, the light having the wavelength of 830 nm was stopped at 88 mA and only the laser beam having the wavelength of 780 nm was emitted.

Figure 11:
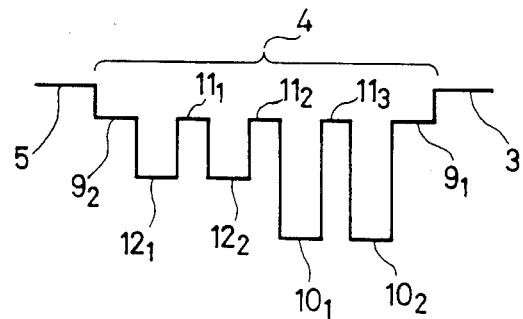
FIGS. 11 to 13 show energy bands of modifications of the present invention.
Figure 12:
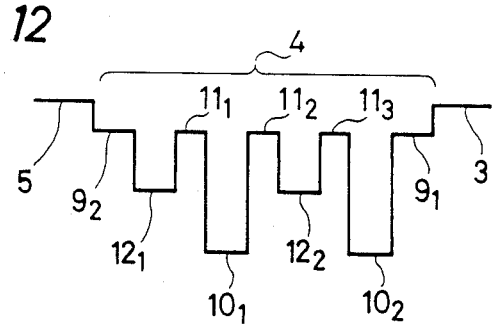
Figure 13:
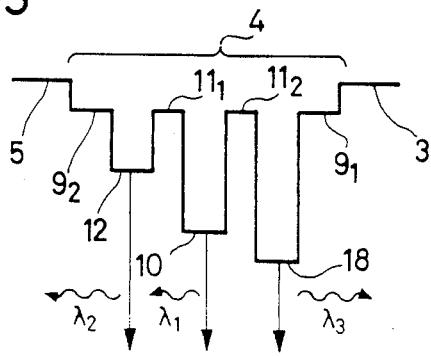

The present invention is not limited to the illustrated embodiments but various modifications thereof may be made. For example, as shown in FIGS. 11 and 12, a plurality of first light emission layers $10_1$ and $10_2$ and a plurality of second light emission layers $12_1$ and $12_2$ may be provided to increase the light output. As shown in FIG. 13, a third light emission layer 18 for emitting a light having a wavelength $\lambda_3$ may be provided to form a three-wavelength laser device. Similarly, four or more-wavelength laser device may be formed. While the AlGaAs system semiconductor laser device is shown in the embodiments, the present invention is applicable to a laser of any material such as InGaAsP system. The present invention includes all such modifications without departing from the scope of the claim. In FIGS. 11 to 13, numerals $11_1$, $11_2$ and $11_3$ denote barrier layers and the like elements to those shown in FIG. 2 are designated by the like numerals and detailed explanation thereof is omitted.

I claim:

1. A semiconductor laser device comprising:
 a semiconductor substrate;
 an optical wave guide structure formed on said substrate and having a first semiconductor light emission layer and a second semiconductor light emission layer and a barrier layer having a wider band gap than that of each of said first and second semiconductor light emission layers, said barrier layer being disposed between said first and second semiconductor light emission layers, wherein said first semiconductor light emission layer and said second semiconductor light emission layer respectively emit light having different wavelengths, and wherein said barrier layers are doped with an impurity;
 a plurality of clad layers stacked on opposite sides of said optical wave guide structure and having a lower refractive index than those of said first and second semiconductor light emission layers and said barrier layers; and
 means for applying a current to said semiconductor light emission layers.

2. A semiconductor laser device according to claim 1, wherein when the current applied by said applying means is approximate to an oscillation threshold, a light gain of one of said light emission layers, having a longer oscillation wavelength, is positive at a predetermined value and a light gain of another of said light emission layers, having a shorter oscillation wavelength, is also positive.

3. A semiconductor laser device according to claim 1, wherein said first light emission layer and second light emission layer emit lights having wavelengths $\lambda_1$ and $\lambda_2$, respectively, and the following condition is met $$\Gamma_2 g_2\left(\frac{L_1 r_1}{L_2 r_{21}} n_{1th}\right) + \Gamma'_2 g'_2(n_{1th}) - \alpha_2 \frac{1}{L} \ln\left(\frac{1}{R}\right) < 0$$

where $n_1$ and $n_2$ are carrier densities of the first light emission layer and the second light emission layer, respectively, $\Gamma_2$ and $g(n_2)$ are confinement factor and gain in the second light emission layer having the oscillation wavelength $\lambda_2$, respectively, $\Gamma'_2$ and $g'_2(n_1)$ are confine coefficient and gain in the first light emission layer having the oscillation wavelength $\lambda_1$, respectively, $r_2$ is a rate of spontaneous emission or nonradiative recombination of carriers in the second light emission layer, $r_{21}$ is a rate of transition of carriers from the second light emission layer to the first light emission layer, $n_{1th}$ is a saturation carrier density of the first light emission layer, $L_1$ and $L_2$ are thickness of the first light emission layer and the second light emission layer, respectively, $\alpha_2$ is a loss coefficient of the light having the wavelength $\lambda_2$, L is a length of a resonator of the device, and R is a mean reflectance of an end plane of the resonator.

4. A semiconductor laser device according to claim 1, wherein said optical wave guide structure includes at least three semiconductor light emission layers for emitting lights of different wavelengths.

5. A semiconductor laser device according to claim 1, wherein said semiconductor substrate, said optical wave guide structure and said clad layers are made of GaAs and AlGaAs.

6. A semiconductor laser device comprising:
 a semiconductor substrate;
 an optical wave guide structure formed on said substrate and having a first semiconductor light emission layer and a second semiconductor light emission layer and a carrier layer having a wider band gap than that of each of said first and second semiconductor light emission layers, said barrier layer being disposed between said first and second semiconductor light emission layers, wherein said first semiconductor light emission layer and said second semiconductor light emission layer respectively emit light having different wavelengths;
 a plurality of clad layers stacked on opposite sides of said optical wave guide structure add having a lower refractive index than that of said optical wave guide structure; and means for applying a current to said semiconductor light emission layers, wherein when a current approximately equal to an oscillation threshold is applied to said semiconductor laser device, a light gain of said light emission layer, having a longer wavelength, is positive with respect to an oscillation frequency of at least another of said light emission layers having a shorter wavelength.

7. A semiconductor laser device according to claim 6, wherein said first light emission layer and second light emission layer emit lights having oscillation wavelengths $\lambda_1$ and $\lambda_2$, respectively, and the following condition is met:

$$\Gamma_2 g_2 \left( \frac{L_1 r_1}{L_2 r_{21}} n_{1th} \right) + \Gamma'_2 g'_2(n_{1th}) - \alpha_2 \frac{1}{L} \ln\left(\frac{1}{R}\right) < 0, \text{ and}$$

wherein $n_1$ and $n_2$ are carrier densities of said first light emission layer and said second light emission layer, respectively, $\Gamma r_2$ and $g(n_2)$ are confinement factor and gain in said second light emission layer having the oscillation wavelength $\lambda_2$, respectively, $r'_2$ and $g'_2$) are confinement factor and gain in said first light emission layer having the oscillation wavelength $\lambda_1$, respectively, $r_2$ is a rate of spontaneous emission or nonradiative recombination of carriers in said second light emission layer, $r_{21}$ is a rate of transition of carriers from said second light emission layer to said first light emission layer, $n_{1th}$ is a saturation carrier density of said first light emission later, $L_1$ and $L_2$ are thickness of said first light layer and said second light emission layer, respectively, $\alpha_2$ is a loss co-efficient of the light having the wavelength $\lambda_2$, L is a length of a resonator of the device, and R is a mean reflectance of an end plane of the resonator.

8. A semiconductor laser device according to claim 6, wherein said optical wave guide structure includes at least three semiconductor light emission layers for emitting light beams of different wavelengths.

9. A semiconductor laser device according to claim 6, wherein said semiconductor substrate, said optical wave guide structure and said clad layers are made of GaAs and AlGaAs.

10. A semiconductor laser device comprising:
a semiconductor substrate;
an optical wave guide structure formed on said substrate and having a first semiconductor light emission layer and a barrier layer having a wider band gap than that of each of said first and second semiconductor light emission layers, said barrier layer being disposed between said first and second semiconductor light emission layers, wherein said first semiconductor light emission layer and said second semiconductor light emission layer respectively emit light having different wavelengths;
a plurality of clad layers stacked on opposite sides of said optical wave guide structure and having a lower refractive index than that of said optical wave guide structure; and
means for applying a current to said semiconductor light emission layers, wherein said first light emission layer and second light emission layer emit light beams having oscillation wavelengths $\lambda_1$ and $\lambda_2$, respectively, and the following condition is met:

$$\Gamma_2 g_2 \left( \frac{L_1 r_1}{L_2 r_{21}} n_{1th} \right) + \Gamma'_2 g'_2(n_{1th}) - \alpha_2 \frac{1}{L} \ln\left(\frac{1}{R}\right) < 0, \text{ and}$$

wherein $n_1$ and $n_2$ are carrier densities of said first light emission layer and said second light emission layer, respectively, $\Gamma_2$ and $g(n_2)$ are confinement factor and gain in said second light emission layer having the oscillation wavelength $\lambda_2$, respectively, $\Gamma'_2$ and $g'_2(n_1)$ are confinement factor and gain in said first light emission layer having the oscillation and wavelength $\lambda_1$, respectively, $r_2$ is a rate of spontaneous emission or nonradiative recombination of carriers in said second light emission layer, $r_{21}$ is a rate of transition of carriers from said second light emission layer to said first light emission layer, $n_{1th}$ is a saturation carrier density of said first light emission layer, $L_1$ and $L_2$ are thickness of said first light emission layer and said second light emission layer, respectively, $\alpha_2$ is a loss coefficient of the light having the wavelength, $\alpha_2$ is a loss coefficient of the light having the wavelength $\lambda_2$, L is a length of a resonator of the device, and R is a mean reflectance of an end plane of the resonator.

11. A semiconductor laser device according to claim 10, wherein said optical wave guide structure includes at least three semiconductor light emission layers for emitting light beams of different wavelengths.

12. A semiconductor laser device according to claim 10, wherein semiconductor substrate, said optical wave guide structure and said clad layers are made of GaAs and AlgaAs.

* * * * *

UNITED STATES PATENT AND TRADEMARK OFFICE
CERTIFICATE OF CORRECTION

PATENT NO. : 4,982,408
DATED : January 1, 1991
INVENTOR(S) : AKIRA SHIMIZU

It is certified that error appears in the above-identified patent and that said Letters Patent is hereby corrected as shown below:

AT [54] TITLE

"SEMICONDUCTION" should read --SEMICONDUCTOR--.

AT [56] REFERENCES CITED

Other Publications,
under van der Ziet, "Quantrum" should read --Quantum--;
under Tsang, "Trasverse" should read --Transverse--; and
under Deppe, "AlxGg1-xAs-GsAs" should read
--$Al_xG_{a1}-xA_s-G_aA_s$--.

Attorney, Agent, or Firm,
"Fitzpatrick, Cella Harper & Scinto" should read
--Fitzpatrick, Cella, Harper & Scinto--.

COLUMN 1

Line 2, "SEMICONDUCTION" should read --SEMICONDUCTOR--.
Line 67, "IV" should read --(IV)--.

COLUMN 2

Line 2, "$\lambda_1$.)" should read --$\lambda_1$).--.

COLUMN 3

Line 3, "layer 2," should read --layer 12,--.
Line 65, "rate rand" should read --rate $r_1$ and--.

UNITED STATES PATENT AND TRADEMARK OFFICE
CERTIFICATE OF CORRECTION

PATENT NO. : 4,982,408
DATED : January 1, 1991
INVENTOR(S) : AKIRA SHIMIZU

It is certified that error appears in the above-identified patent and that said Letters Patent is hereby corrected as shown below:

COLUMN 4

Line 11, "where h107 $_1$" should read --where $h\omega_1$--.
Line 12, "wavelengths $\lambda_1 1$" should read --wavelengths $\lambda_1$--.
Line 16, "$\Gamma_{24}$" should read --$\Gamma_2$--.
Line 67, "density nin the" should read --density $n_1$ in the--.

COLUMN 6

Line 20, "of $g(n_1)$" should read --of $g_1(n_1)$--.

COLUMN 7

Line 5, "$1=10^{18} cm^{-3}$)" should read --$1 \times 10^{18} cm^{-3}$)--.

COLUMN 8

Line 26, "actualy" should read --actually--.
Line 54, "followings" should read --following--.

COLUMN 9

Line 4, "first" should read --second--.
Line 18, "$9_2$." should read --$9_1$.--.

UNITED STATES PATENT AND TRADEMARK OFFICE
CERTIFICATE OF CORRECTION

PATENT NO. : 4,982,408

DATED : January 1, 1991

INVENTOR(S) : AKIRA SHIMIZU

It is certified that error appears in the above-identified patent and that said Letters Patent is hereby corrected as shown below:

COLUMN 10

Line 22, "met" should read --met:--.

Line 25, "$\Gamma_2 g_2 \left( \frac{L_1 r_1}{L_2 r_2} n_{1th} \right) + \Gamma'_2 g'_2 (n_{1th}) - \alpha_2 \frac{1}{L} \ln\left(\frac{1}{R}\right) < 0$"

should read $$--\Gamma_2 g_2 \left( \frac{L_1 r_1}{L_2 r_2} n_{1th} \right) + \Gamma'_2 g'_2 (n_{1th}) - \alpha_2 \frac{1}{L} \ln\left(\frac{1}{R}\right) < 0 --.$$

Line 30, "$\Gamma_2$ and $g(n_2)$" should read --$\Gamma_2$ and $g_2(n_2)$--.

Line 31, "layer having the oscillation" should read --layer at the--.

Line 32, "are confine" should read --are--.

Line 33, "coefficient and" should read --cofinement factor and--.

Line 34, "having the oscillation wavelength $\lambda_1$," should read --at the wavelength $\lambda_2$,--.

Line 59, "carrier" should read --barrier--.

UNITED STATES PATENT AND TRADEMARK OFFICE
CERTIFICATE OF CORRECTION

PATENT NO. : 4,982,408

DATED : January 1, 1991

INVENTOR(S) : AKIRA SHIMIZU

It is certified that error appears in the above-identified patent and that said Letters Patent is hereby corrected as shown below:

<u>COLUMN 11</u>

Line 18, " $\Gamma_2 g_2 \left( \frac{L_1 r_1}{L_2 r_2 1} n_{1th} \right) + \Gamma'_2 g'_2 (n_{1th}) - \alpha_2 \frac{1}{L} \ln \left( \frac{1}{R} \right) < 0$ "

should read

-- $\Gamma_2 g_2 \left( \frac{L_1 r_1}{L_2 r_2 1} n_{1th} \right) + \Gamma'_2 g'_2 (n_{1th}) - \alpha_2 \frac{1}{L} \ln \left( \frac{1}{R} \right) < 0$ --.

Line 23, "$\Gamma r_2$ and $g(n_2)$" should read --$\Gamma r_2$ and $g_2(n_2)$--.
Line 24, "having the oscil-" should read --at the--.
Line 25, "lation" should be deleted and
"$r'_2$ and $g'_2$)" should read --$\Gamma'_2$ and $g'_2(n_1)$--.
Line 27, "having the oscillation wavelength $\lambda_1$," should read --at the wavelength $\lambda_2$,--.
Line 33, "light layer" should read
--light emission layer--.
Line 50, "a barrier" should read --a second semiconductor light emission layer and a barrier--.

UNITED STATES PATENT AND TRADEMARK OFFICE
CERTIFICATE OF CORRECTION

PATENT NO. : 4,982,408

DATED : January 1, 1991

INVENTOR(S) : AKIRA SHIMIZU

It is certified that error appears in the above-identified patent and that said Letters Patent is hereby corrected as shown below:

COLUMN 12

Line 20, " $\Gamma_2 g_2 \left( \frac{L_1 r_1}{L_2 r_2 1} n_{1th} \right) + \Gamma'_2 g'_2 (n_{1th}) - a_2 \frac{1}{L} \ln \left( \frac{1}{R} \right) < 0$ "

should read

-- $\Gamma_2 g_2 \left( \frac{L_1 r_1}{L_2 r_2 1} n_{1th} \right) + \Gamma'_2 g'_2 (n_{1th}) - a_2 \frac{1}{L} \ln \left( \frac{1}{R} \right) < 0$ --.

Line 25, "$\Gamma_2$ and $g(n_2)$" should read --$\Gamma_2$ and $g_2(n_2)$--.
Line 26, "having the oscil-" should read --at the--.
Line 27, "lation" should be deleted.
Line 29, "layer having the oscillation and wavelength $\lambda_1$," should read --layer at the wavelength $\lambda_2$,--.

Signed and Sealed this

Twentieth Day of April, 1993

Attest:

MICHAEL K. KIRK

Attesting Officer

Acting Commissioner of Patents and Trademarks